United States Patent [19]

Kishi

[11] Patent Number: 5,153,694
[45] Date of Patent: Oct. 6, 1992

[54] A SEMICONDUCTOR DEVICE HAVING A COLLECTOR STRUCTURE FREE FROM CRYSTAL DEFECTS

[75] Inventor: Shuji Kishi, Tokyo, Japan
[73] Assignee: NEC Corporation, Tokyo, Japan
[21] Appl. No.: 661,500
[22] Filed: Feb. 26, 1991

[30] Foreign Application Priority Data
Mar. 2, 1990 [JP] Japan .................. 2-49220

[51] Int. Cl.[5] .............. H01L 29/12; H01L 27/12; H01L 29/06; H01L 23/48
[52] U.S. Cl. ...................... 357/36; 357/49; 357/55; 357/65; 357/68
[58] Field of Search .............. 357/34, 36, 49, 65, 357/68, 59, 90, 55, 27

[56] References Cited

U.S. PATENT DOCUMENTS

| 3,667,008 | 5/1972 | Katnack ............... 357/34 |
| 3,740,835 | 6/1973 | Duncan ............... 357/59 |
| 4,466,178 | 8/1984 | Soclof ................ 357/34 |
| 4,499,657 | 2/1985 | Ooga et al. .......... 357/59 |
| 4,511,912 | 4/1985 | Mahrla ............... 357/34 |
| 5,003,367 | 3/1991 | Dathe et al. ......... 357/34 |
| 5,047,831 | 9/1991 | Katayama ............. 357/90 |

FOREIGN PATENT DOCUMENTS 57-10230 1/1982 Japan .

OTHER PUBLICATIONS

E. Levine et al., "Diffusion-Induced Defects in Silicon. I", *Journal of Applied Physics*, vol. 38, (Jan. 1967) pp. 81-87.

Primary Examiner—J. Carroll
Attorney, Agent, or Firm—Laff, Whitesel, Conte & Saret

[57] ABSTRACT

A semiconductor device includes a semiconductor layer, an insulating film, a polysilicon film, and a plurality of high-impurity concentration regions. The semiconductor layer has a first conductive region and a second conductive region of a conductivity type opposite to that of the first conductive region. The insulating film is formed on the semiconductor layer having a plurality of small windows on at least said first conductive region. The polysilicon film covers the insulating film and is in contact with the semiconductor layer through the small windows. The plurality of high-impurity concentration regions are formed corresponding to the small windows.

3 Claims, 6 Drawing Sheets

A SEMICONDUCTOR DEVICE HAVING A COLLECTOR STRUCTURE FREE FROM CRYSTAL DEFECTS

BACKGROUND OF THE INVENTION

The present invention relates to a semiconductor device having a high-impurity-concentration diffusion layer which is free from crystal defects.

In general, parasitic resistances in respective elements are regarded as one factor for degrading the performance of a device such as an IC or an LSI. For example, in a bipolar transistor, an emitter parasitic resistance $r_e$, a base parasitic resistance $r_b$, and a collector parasitic resistance $r_c$ are generated. Of these resistances, the collector parasitic resistance is most important. That is, since a transient response of a transistor and a large-current operation speed are often suppressed by the collector resistance, it is a key point of characteristic improvement of a bipolar transistor to decrease a collector saturation resistance (to be referred to as $r_{sc}$ hereinafter) measured in a state wherein the transistor is saturated.

FIG. 3A shows a conventional bipolar transistor, and FIG. 3B shows the bipolar transistor along a line IIIB—IIIB. The transistor is manufactured as will be described below. A high-impurity-concentration n-type buried collector layer 2 is formed on a p-type silicon substrate 1, an n-type epitaxial layer 3 is grown thereon, and a p-type base layer 4 and an n-type emitter layer 5 are sequentially formed. Reference numeral 6a denotes a high-impurity-concentration n-type diffusion layer for compensating a collector resistance; 7a and 8, polysilicon films; 9, an insulating isolation groove; and 10, an insulating film made of an $SiO_2$ film or the like. Reference numerals 11a, 11b, and 11c denote collector, emitter, and base electrode extraction windows, respectively. The size of the collector electrode extraction window 11a is given by $x \times y$ in FIG. 3A. Note that an aluminum wiring and the like are omitted for descriptive convenience.

A collector parasitic resistance can be calculated by the resistances $r_1$, $r_2$, and $r_3$ of the epitaxial layer 3, the buried collector layer 2, and the n-type diffusion layer 6a. The collector parasitic resistance is given as $r_c = r_1 + r_2 + r_3$. When the transistor is saturated, the resistance satisfies condition $r_{sc} = r_1 + r_2$, and the resistance $r_3$ is negligible. In this case, the resistance $r_1$ is determined by a sheet resistance $\rho_1$ of the diffusion layer and the pattern size thereof, and the resistance $r_2$ is determined by a sheet resistance $\rho_1$ of the buried collector layer and the pattern size thereof. As the sheet resistance $\rho_2$ of the buried collector layer, a value of about 20 $\Omega/\square$ can be stably obtained by a coating diffusion method or an ion implantation method generally using an arsenic glass film as a diffusion source. However, since the sheet resistance $\rho_1$ is changed from several tens $\Omega/\square$ to several $k\Omega/\square$ depending on the type of method of doping an impurity, the saturation resistance $r_{sc}$ can be determined by the sheet resistance $\rho_1$. In other words, the characteristics of the transistor depend on the sheet resistance $\rho_1$.

It is important to dope a higher-concentration-impurity to decrease the sheet resistance $\rho_1$. As a diffusion method, the following method is used as described in, e.g., Japanese Patent Laid-Open No. 57-10230. That is, a polysilicon film is left to cover an electrode window, and a collector contact layer is formed on a semiconductor surface through the polysilicon film. In FIGS. 3A and 3B, phosphorus P is doped in a polysilicon film 7a by thermal diffusion using a $POCl_3$ vapor, and the phosphorus P is diffused from the polysilicon film 7a in an epitaxial layer 3 in an $N_2$ gas. According to this method, variations in resistance of films in a wafer surface are small, and controllability in the direction of depth of the wafer is excellent. In addition, high-impurity-concentration phosphorus P can be advantageously doped by this method.

Therefore, even in the above conventional diffusion method, when an integration density is not high, a parasitic resistance can be suppressed to be less than a predetermined value even when the impurity concentration of the diffusion layer is about $10^{19}$ atoms/cm$^3$. In recent years, as a high integration density has been demanded, a pattern size has been required to be minimized, and an area for a collector has been decreased accordingly. In order to cope with this, an impurity concentration must be increased to be about $10^{20}$ atoms/cm$^3$ or more. For this reason, a conventional method cannot overcome this problem.

For example, in order to decrease the size of the transistor in FIG. 3, since a length x is determined by the length of an emitter electrode extraction window 11b, a length y must be decreased. Although even $x \times y = 6 \times 3$ $\mu m^2$ is satisfactory in past, $x \times y = 6 \times 1.2$ $\mu m^2$ must be satisfied at present. When a phosphorus concentration is increased to compensate this decrease, a yield of products is decreased. If the phosphorus concentration is increased up to a predetermined concentration, the yield of products is gradually decreased to almost zero.

This defect is electrically detected as junction leakage of a transistor. Crystal defects are mainly caused by leakage of the junction of bipolar transistors. When crystal defects were observed by a transmission electron microscope (TEM) in a defective product, dislocations were detected. The density of dislocations is highest in a phosphorus diffusion window and rapidly decreased in accordance with an increase in distance from the window. Several dislocations reach an emitter junction and a base junction. In short, since dislocations which occur from the phosphorus diffusion layer extend through the emitter and base junctions, junction leakage occurs.

As described above, since a yield of transistors is decreased depending on a phosphorus concentration, when the size of the window is set to be $6.0 \times 1.2$ $\mu m^2$ and a relationship between a peak phosphorus concentration and the number of dislocations reaching an emitter is inspected, the result in FIG. 4 can be obtained. As shown in FIG. 4, when the peak concentration is higher than $7 \times 10^{19}$, the number of dislocations is rapidly increased.

SUMMARY OF THE INVENTION

It is a principle object of the present invention to provide a semiconductor device free from junction leakage due to a dislocation even when an impurity concentration of an impurity diffusion layer is increased.

It is another object of the present invention to provide a compact semiconductor device having high performance.

It is still another object of the present invention to provide a semiconductor device with a high yield of products.

In order to achieve the above objects of the present invention, there is provided a semiconductor device comprising a semiconductor layer having a first conductive region and a second conductive region of a conductivity type opposite to that of the first conductive region, an insulating film formed on the semiconductor layer and having a plurality of small windows on at least the first conductive region, a polysilicon film covering the insulating film and contacting the semiconductor layer through the small windows, and a plurality of high-impurity-concentration diffusion regions corresponding to the small windows.

DESCRIPTION OF THE PREFERRED EMBODIMENTS

The inventors inspected the sizes of windows and the number of dislocations since a yield of products depends on the sizes of transistors.

Figure 3A:
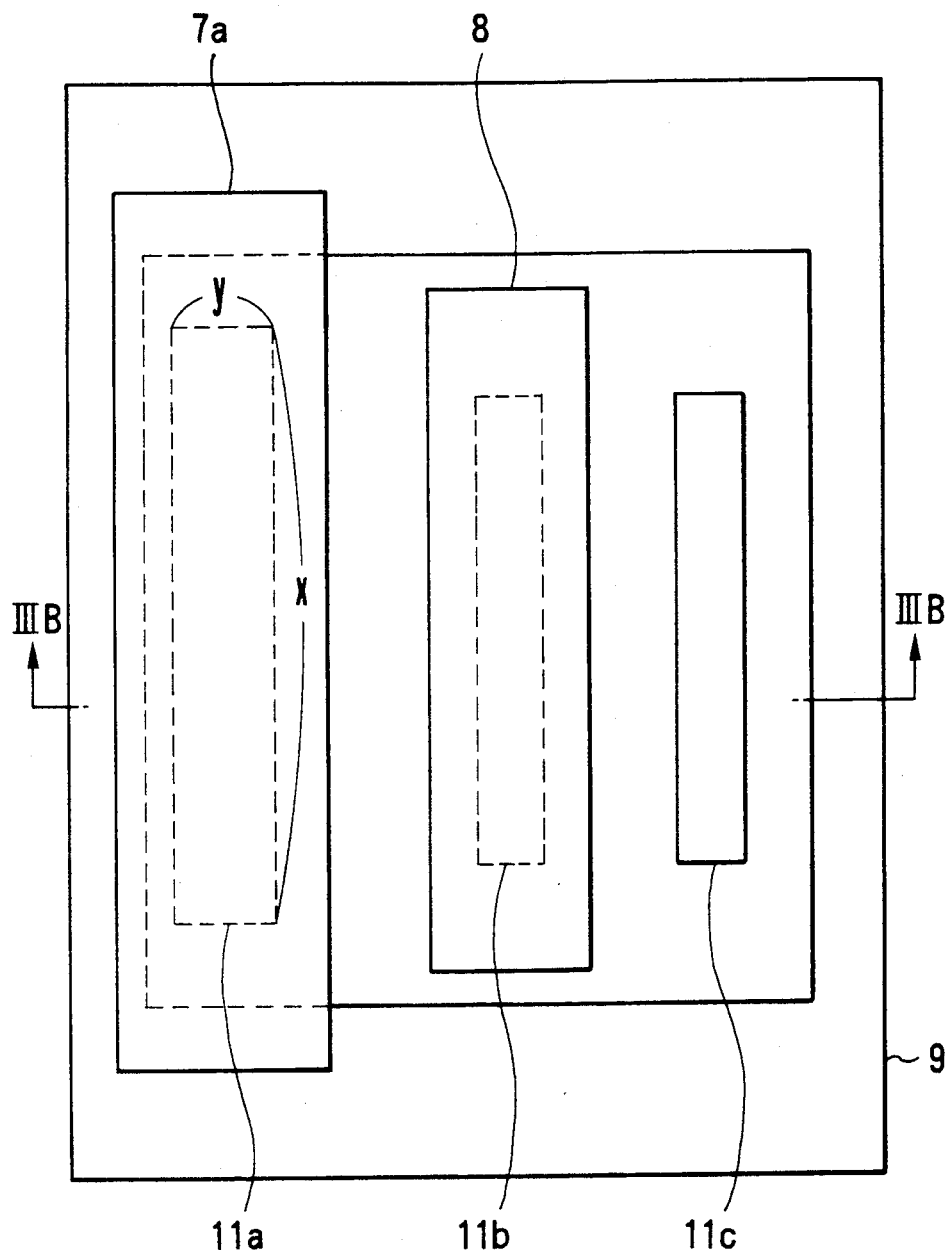
FIG. 3A is a plan view showing a conventional semiconductor device.
Figure 3B:
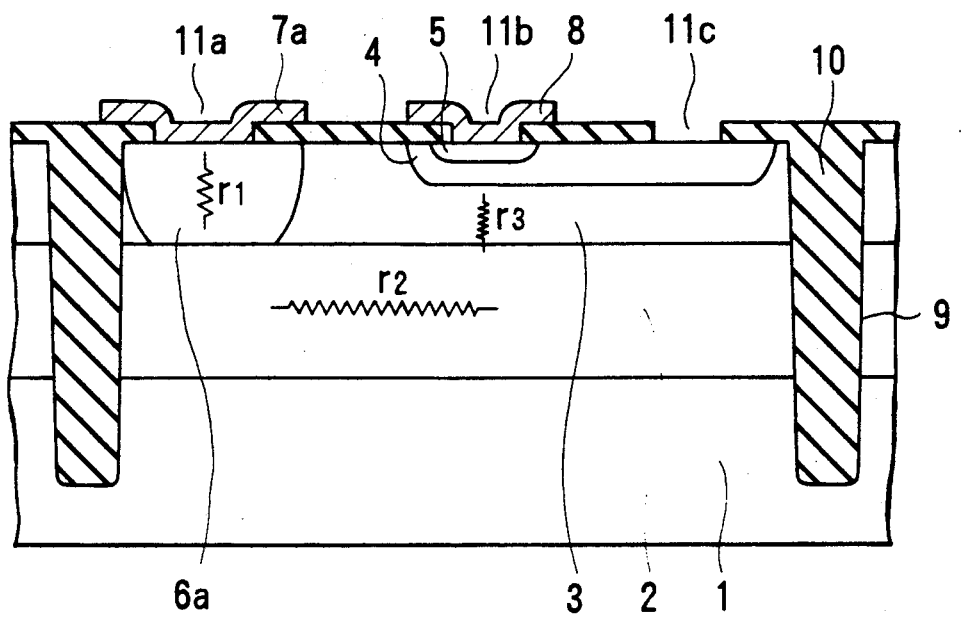
FIG. 3B is a sectional view showing a semiconductor device along a line IIIB—IIIB in FIG. 3A.
Figure 5:
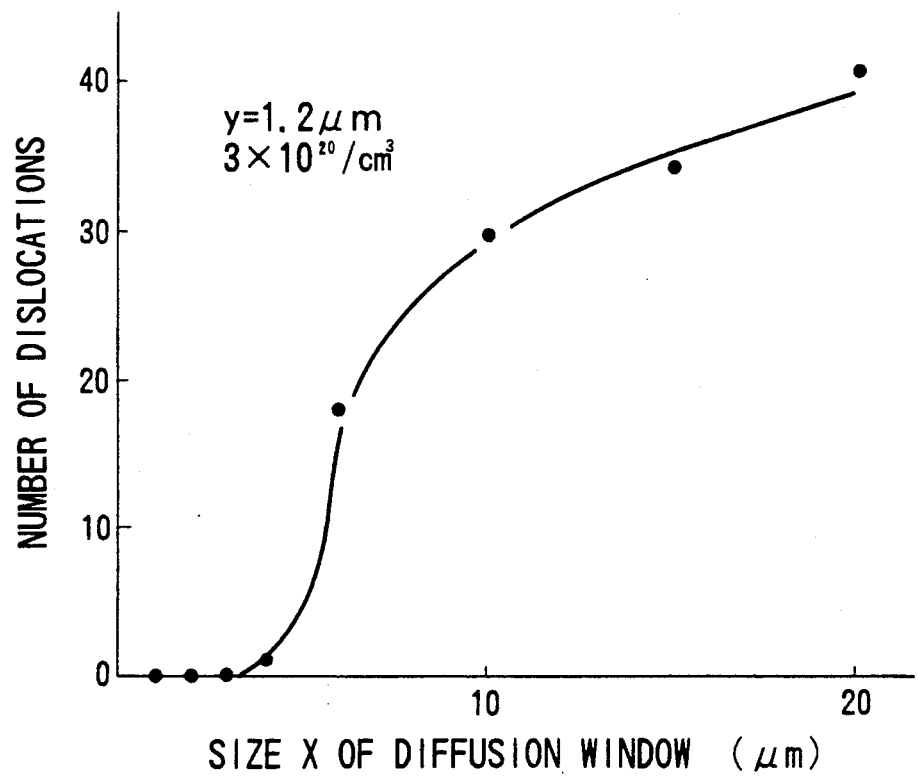
FIG. 5 is a graph showing a relationship between the size of a diffusion window and the number of dislocations.

FIG. 5 shows a relationship between a length x and the number of dislocations reaching an emitter, when a peak concentration of phosphorus is set to be $3 \times 10^{20}$ atoms/cm$^3$, y=1.2 μm is satisfied, and the length x is changed from 1.0 to 20 μm in the transistor shown in FIGS. 3A and 3B. As is apparent from FIG. 5, when the length x is larger than 4 μm, the number of dislocations is rapidly increased. In addition, when the value y is changed to 2.0 μm and 4.0 μm, the number of dislocations is changed as described above.

Figure 4:
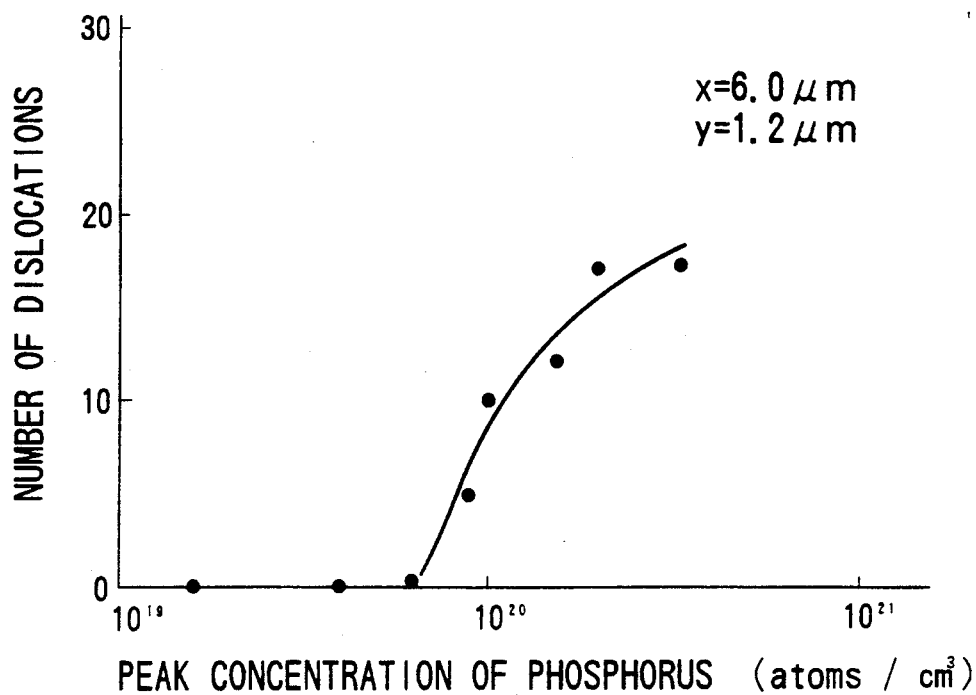
FIG. 4 is a graph showing a relationship between a peak concentration of phosphorus and the number of dislocations.

When these analysis results in FIGS. 4 and 5 are taken into consideration together with a literature (JOURNAL OF APPLIED PHYSICS volume 38, Number 1, 1967, E. Levine et al. [Diffusion Induced in Silicon]) describing that a stress acts on a crystal by doping phosphorus or boron to cause defects to occur, the following summary can be obtained:

1a stress acts on a silicon crystal upon diffusion of phosphorus, and dislocations occur so as to release the stress; and 2 the stress becomes stronger as the size of a window is increased or the window is elongated, and the stress is generated more strongly as the phosphorus concentration is increased.

That is, when the diffusion window is made to be smaller than a predetermined size, even if the phosphorus concentration is increased to some extent, occurrence of dislocations reaching an emitter can be suppressed. Therefore, in order to form a diffusion layer having an area larger than a predetermined area while occurrence of dislocations is suppressed, the window need only be divided into small windows.

An experiment of increasing a phosphorus concentration was conducted in consideration of advanced micropatterning in the future. As a result, even in a structure in which small windows each having a size of $1.2 \times 1.2$ μm$^2$ were aligned in a line, it was found that dislocations began to be observed when a peak phosphorus concentration exceeded $4 \times 10^{20}$ atoms/cm$^3$. When this expected state of occurrence of dislocations was inspected, although a dislocation occurred from a phosphorus diffusion region and was terminated at another diffusion region to form a dislocation loop, a large number of dislocations were terminated on a side wall surface of an isolation groove and, especially, in a side wall surface in an epitaxial layer. For this reason, when a transistor surrounded by an isolation groove from three directions was formed, it was apparent that the number of dislocations extending to an emitter was extremely decreased in this transistor compared with that in a transistor having a small window only one side of which has an isolation groove. That is, in a diffusion layer surrounded by an isolation groove from three directions, the side wall surfaces of the isolation grooves serve as getter sites, and a dislocation extending to an emitter is suppressed.

Figure 1A:
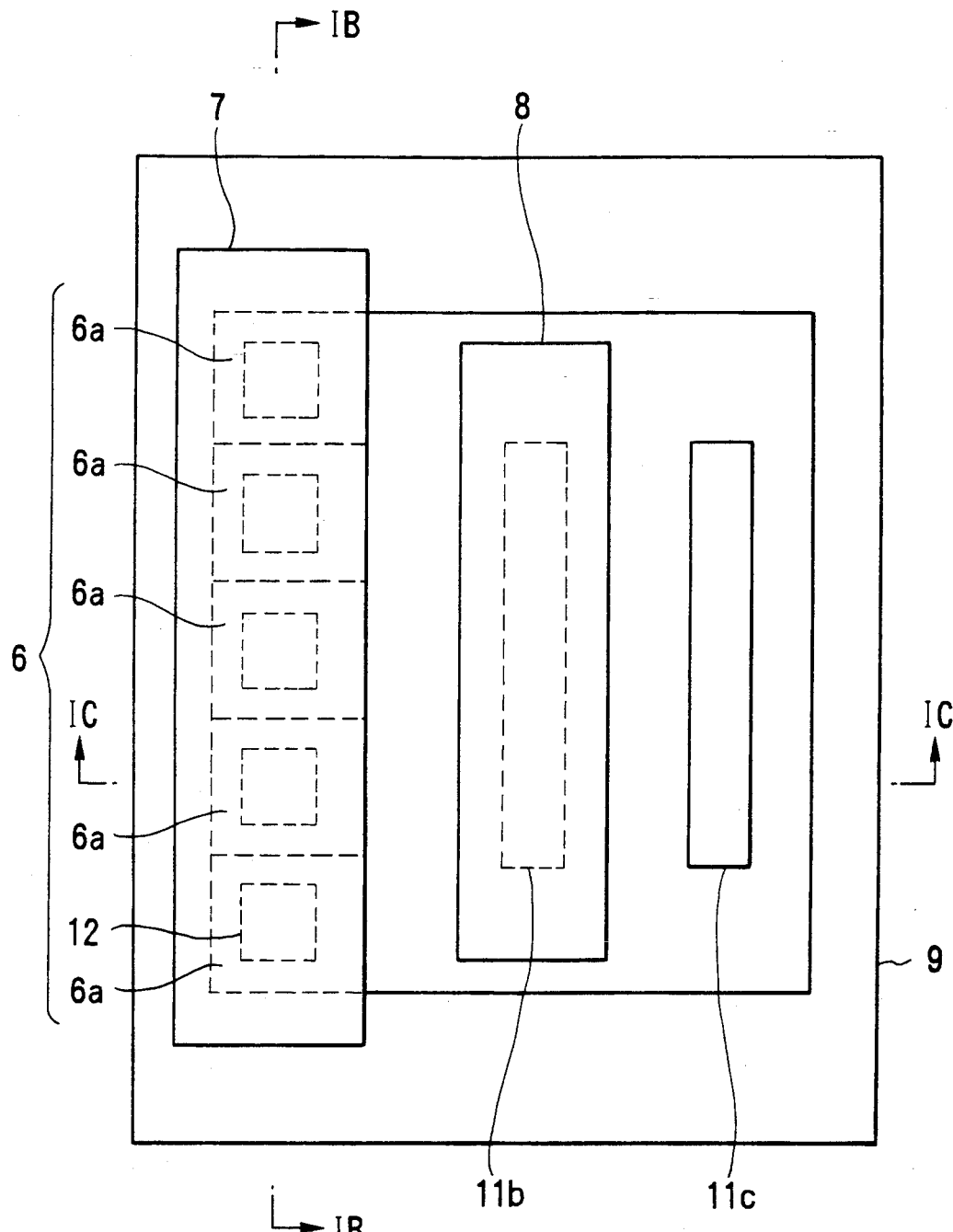
FIG. 1A is a plan view showing a semiconductor device according to the first embodiment of the present invention.
Figure 1B:
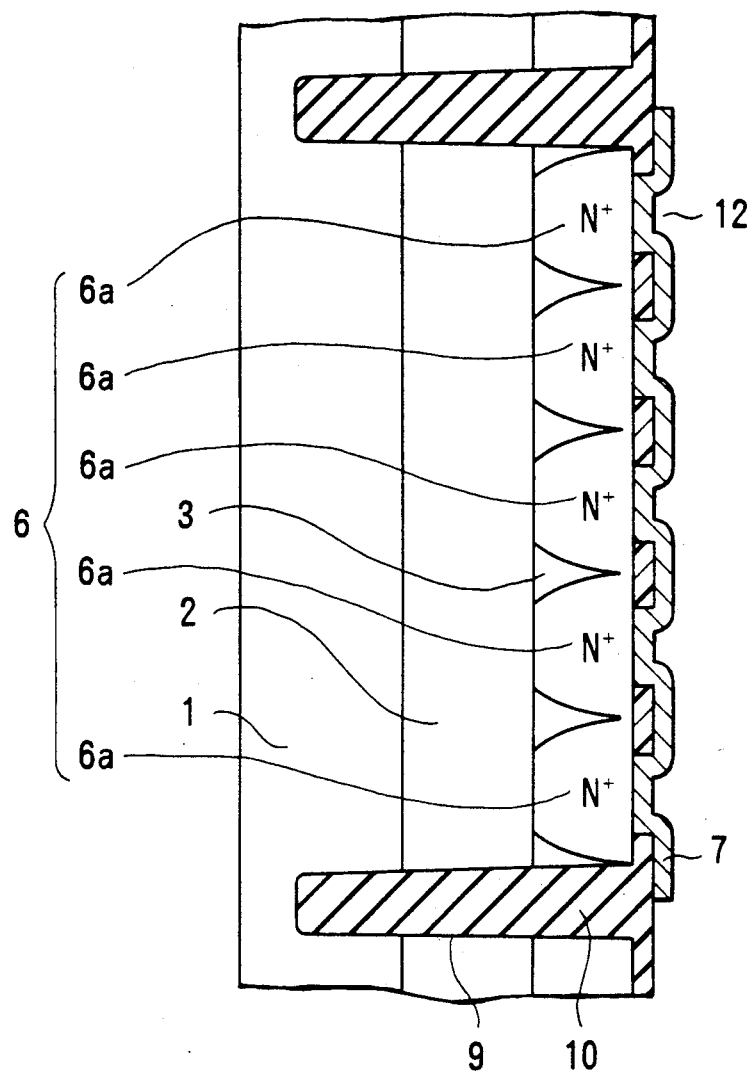
FIG. 1B is a sectional view showing the semiconductor device along a line IB—IB in FIG. 1A.
Figure 1C:
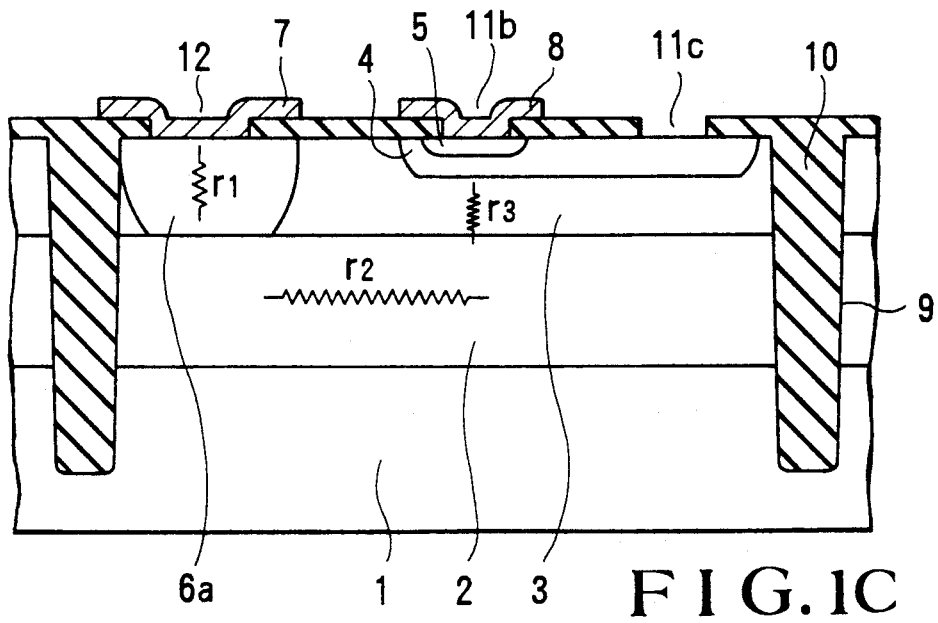
FIG. 1C is a sectional view showing the semiconductor device along a line IC—IC in FIG. 1A.

FIG. 1A shows a bipolar transistor of a semiconductor device according to the first embodiment of the present invention, FIG. 1B shows the bipolar transistor along a line IB—IB in FIG. 1A, and FIG. 1C shows the bipolar transistor along a line IC—IC. Referring to FIGS. 1A to 1C, the transistor is manufactured as will be described below. That is, a high-impurity-concentration n-type buried collector layer 2 is formed on a p-type silicon substrate 1, an n-type epitaxial layer 3 is grown thereon, and a p-type base layer 4 and an n-type emitter layer 5 are sequentially formed. Reference numeral 6 denotes a high-impurity-concentration n-type diffusion layer for compensating a collector resistance; 6a, a plurality of n$^+$-type diffusion regions for forming the layer 6; 8, a polysilicon film; 9, an insulating isolation groove; 10, an insulating film made of an SiO$_2$ film or the like; 11b, an emitter electrode extraction window; and 11c, a base electrode extraction window. Collector extraction windows are formed in the insulating film 10 as a plurality of small windows 12 for dividing the conventional window 11a shown in FIG. 3A. A polysilicon film 7 is formed on the small windows, and the high-impurity-concentration n$^+$-type diffusion regions 6a are formed through the polysilicon film 7 by the same method as in FIG. 3. In this case, as shown in FIG. 1B, the regions 6a are formed to be coupled with each other, thereby forming the high-impurity-concentration n-type layer 6. In FIGS. 1A to 1C, a conventional window having a size of $1.2 \times 10$ μm$^2$ is divided into five small windows each having a size of $1.2 \times 1.2$ μm$^2$. A collector parasitic resistance $r_c$ consists of resistances $r_1$, $r_2$, and $r_3$ of the epitaxial layer 3, the buried collector layer 2, and the n-type diffusion layer 6.

A method of manufacturing the above transistor will be simply described below. A polysilicon film for covering the small windows 12 was deposited by a CVD method to have a thickness of 3,000 Å. The resultant structure was subjected to diffusion in a POCl$_3$ gas atmosphere of 2,000 ppm at a temperature of 950° C. for twenty minutes and in $N_2$ gas at a temperature of 1,000° C. for twenty minutes.

According to this embodiment, even when a peak phosphorus concentration was increased to about $2 \times 10^{20}$ atoms/cm$^3$ to decrease the resistance $r_{sc}$ to 40 Ω, no junction leakage was observed. Contrast to this, a limit concentration of phosphorus at which a dislocation occurred was about $2 \times 10^{19}$ atoms/cm$^3$ when a conventional single window having a size of $1.2 \times 10$ μm$^2$ was used. In this case, the resistance $r_{sc}$ was about 120 Ω. In the performance of a transistor, the resistance $r_{sc}$ must be 50 Ω or less. According to the present invention, this demand could be satisfied.

Figure 2A:
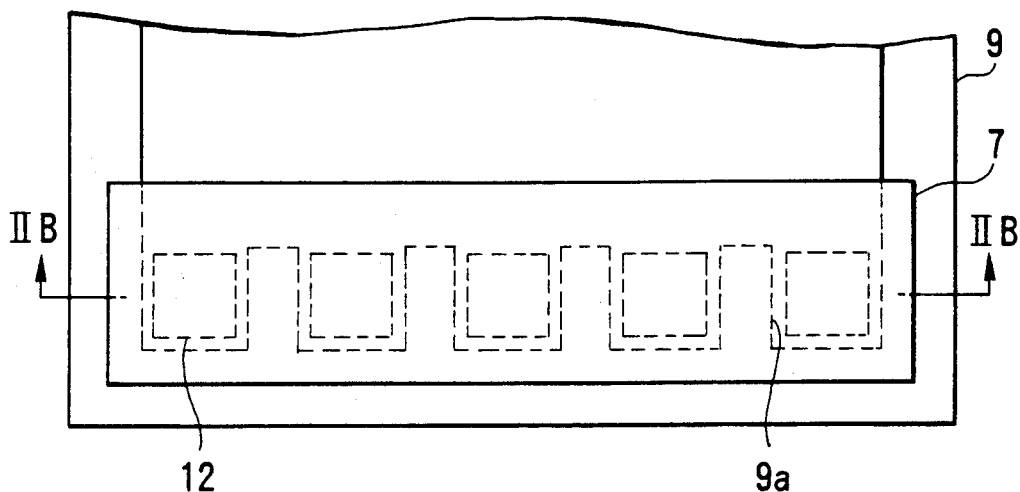
FIG. 2A is a plan view showing a semiconductor device according to the second embodiment of the present invention.
Figure 2B:
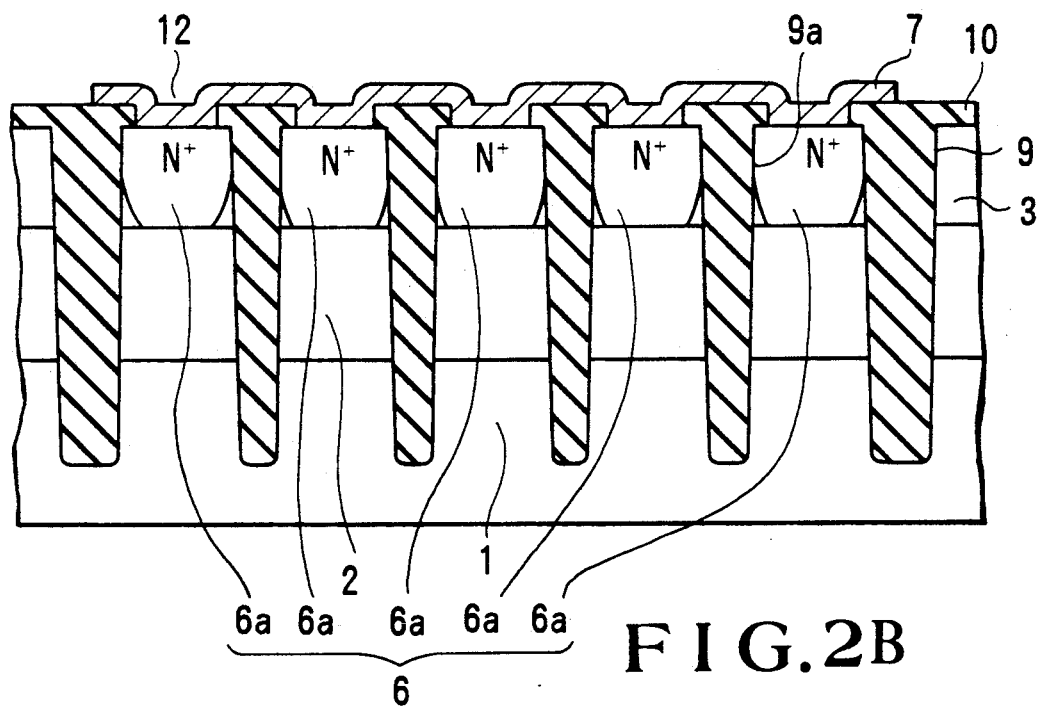
FIG. 2B is a sectional view showing the semiconductor device along a line IIB—IIB in FIG. 2A.

FIG. 2A shows a bipolar transistor of a semiconductor device according to the second embodiment of the present invention, and FIG. 2B shows a bipolar transistor along a line IIB—IIB in FIG. 2B. This embodiment was made on the basis of a finding that the number of dislocations reaching an emitter was smaller in a small window surrounded by an isolation groove from three directions than in a small window only one side of which had an isolation groove. In this embodiment, a small window 12 having the same size as described in the first embodiment was arranged, and an isolation groove 9a filled with an insulator was arranged in a silicon substrate in the small window. The isolation groove 9a is a region integrated with the insulating isolation groove 9. In order to obtain a maximum effect of the isolation groove 9a, a distance between a diffusion window and the groove must be decreased as small as possible. When this distance was set to be 0.2 μm, doping could be performed at a concentration up to about $7 \times 10^{20}$ atoms/cm$^3$ as a peak phosphorus concentration. In this case, the resistance $r_{sc}$ had a value of about 25 Ω. As a result, the resistance $r_{sc}$ could be improved by 40%.

As described above, according to the present invention, since an impurity diffusion window of a semiconductor device is divided into a plurality of small windows to form a diffusion layer through a polysilicon film, an impurity concentration of the diffusion layer can be increased while occurrence of dislocations is suppressed. Therefore, according to the present invention, a parasitic resistance is decreased to obtain the high performance of the device, and a decrease in yield of products can be prevented while a high performance is kept in a compact device.

What is claimed is:

1. A collector structure in a semiconductor device device comprising:
    a p-type silicon substrate (1) under an n-type buried layer (2) and an n-type epitaxial layer (3), stacked in the order names;
    an insulating film (10) formed on a surface of said silicon substrate, in which a plurality of small windows (12) having the same size are aligned in a line;
    a polysilicon film (7) covering said insulating film and contacting said n-type epitaxial layer through said small windows; and
    a plurality of n-type diffusion regions (6) with a peak phosphorus concentration of more than $10^{20}$ atoms/cm$^3$ in said n-type epitaxial layer in order to contact said n-type buried layer, said diffusion regions being self-aligned to said small windows respectively wherein an isolation groove is formed in said epitaxial layer for an insulation between said small windows.

2. A device according to claim 1, wherein said isolation groove is comb-formed to surround each of said small windows from three directions.

3. A device according to claim 1, wherein a distance between said isolation groove and n-type diffusion is not more than 0.2 μm.

* * * * *